United States Patent [19]
Yacoubian et al.

[11] Patent Number: 5,489,877
[45] Date of Patent: Feb. 6, 1996

[54] BROADBAND AMPLIFIER HAVING UNIFORM FREQUENCY RESPONSE

[75] Inventors: Marc Yacoubian, Long Beach; Edward Rosen, Fountain Valley; Norman F. Reinhardt, Camarillo, all of Calif.

[73] Assignee: Pico Products, Inc., Lakeview Terrace, Calif.

[21] Appl. No.: 329,419

[22] Filed: Oct. 27, 1994

[51] Int. Cl.$^6$ .................................................. H03F 3/60
[52] U.S. Cl. ................................. 330/286; 330/306
[58] Field of Search ............................. 330/53, 56, 286, 330/306

[56] References Cited

U.S. PATENT DOCUMENTS 4,053,842 10/1977 Turski et al. ..................... 330/53 X
4,638,261 1/1987 McGuire et al. ................. 330/286 X

*Primary Examiner*—James B. Mullins
*Attorney, Agent, or Firm*—William H. Eilberg

[57] ABSTRACT

A broadband amplifier includes an amplifier device and input and output networks formed of microstrips. The impedance of the output microstrip is chosen by taking the geometric mean of the real parts of one of the scattering parameters of the amplifier device, at the lower and upper limits of the frequency range of interest, and by taking the geometric mean of the system impedance with the result obtained previously. The final result of these calculations is the impedance of the output network. The impedance of the input network is made to be at least twice, and preferably twice, the impedance of the output network. The amplifier is also provided with a slope compensation circuit. It has been discovered that an amplifier designed in this manner exhibits remarkable flatness over a five-octave range. The amplifier circuit is therefore suitable for use in cable television and other broadband telecommunications applications, where the frequency range of interest may be 30 MHz to 1000 MHz.

18 Claims, 4 Drawing Sheets

BROADBAND AMPLIFIER HAVING UNIFORM FREQUENCY RESPONSE

BACKGROUND OF THE INVENTION

This invention relates to the field of broadband amplifiers, especially those amplifiers used in cable television and telecommunications systems. The amplifier circuit of the present invention has an extremely uniform response over a very wide range of frequencies.

A cable television system requires an amplifier capable of providing a desired amount of amplification over a wide bandwidth, typically from 30 MHz to 1000 MHz. It is desired that the amplifier have a gain which remains within +/−1 dB (and preferably +/−0.5 dB) of a desired value over the frequency range of interest. Of course, the gain of conventional amplifiers varies with frequency. A conventional amplifier, operated alone, simply cannot achieve the desired flatness over the five-octave frequency range specified above. In order to achieve the desired flatness over the des i red frequency range, it has been necessary to use multiple compensation circuits and/or additional amplifiers.

One type of amplifier which is especially suitable for use in cable television systems is the monolithic microwave integrated circuit (MMIC). Such devices are commercially available; a typical MMIC is the MSA-1104, sold by Hewlett-Packard. The latter MMIC is designed for use over a broad frequency band. Nevertheless, when used from 30 MHz to 1000 MHz, the latter MMIC has a gain which varies by about 2.1 dB over this range. FIG. 4a provides a graph of gain versus frequency for this MMIC. The graph is negatively sloped, indicating that the gain of the amplifier decreases towards the upper end of the frequency range. In order to use the MMIC throughout the desired frequency range, it is necessary somehow to compensate for this variation so that the frequency response is essentially flat.

It has been known to compensate for a sloped frequency response curve by adding a circuit having a transfer function that is negative with respect to that of the original amplifier. Such a compensation circuit could comprise "lumped" elements which include capacitors, inductors, and resistors. An example of such a compensation circuit is shown within the dotted lines in FIG. 2. But it turns out that this slope compensation circuit alone does not yield the desired flatness of frequency response because it presents a non-constant impedance across the desired bandwidth.

The present invention provides a circuit which achieves the desired flatness of response over the five-octave frequency range mentioned above. The invention combines either a conventional MMIC, an MIC (i.e. a microwave integrated circuit, in which the active device is monolithic but is mounted on a substrate having other discrete components), or a discrete transistor with a slope compensation circuit, and with a network of microstrips, so as to provide the necessary frequency compensation.

SUMMARY OF THE INVENTION

The amplifier circuit of the present invention includes an amplifier device, a slope compensation circuit, and input and output networks connected to the amplifier device. The essence of the invention resides in the selection of the impedances of the input and output networks.

To determine the impedances of the input and output networks, one first determines the scattering parameter $s_{22}$ for the amplifier device. The parameter $s_{22}$ represents the ratio of incident and reflected power at the output port of the MMIC or transistor and is characteristic of that particular device. The values of parameter $s_{22}$, for each of several frequencies, are generally provided by the manufacturer of the amplifier device. One then obtains the real parts of the values of $s_{22}$ at the lowest and highest frequencies of the range within which the amplifier is to operate.

One next takes the geometric mean of the values obtained above. Then, one obtains the geometric mean of the system impedance and the result previously calculated. The latter result is the impedance of the output network. The impedance of the input network should then be made at least twice the impedance of the output network.

Each of the input and output networks comprises a microstrip, or a set of microstrips, mounted on a circuit board and connected to the input and output ends of the amplifier device. The impedances of each microstrip can be readily selected by appropriate choice of dimensions.

While the impedance of the input network may be more than twice the impedance of the output network, it is generally preferable to keep the value of the input network impedance as low as practical. Therefore, the preferred value for the impedance of the input network is about twice that of the output network.

The circuit made according to the procedure described above exhibits the desired flatness of frequency response over the above-mentioned five-octave bandwidth.

The present invention therefore has the primary object of providing an amplifier whose frequency response is essentially flat over a wide bandwidth.

The invention has the further object of making it possible to use a single amplifier over a frequency range of about 30 MHz to 1000 MHz.

The invention has the further object of providing an amplifier as described above, wherein the amplifier does not need to be combined with expensive auxiliary components, or with other amplifiers, to achieve the desired flat response.

The invention has the further object of improving the utility and efficiency, and reducing the cost, of amplifiers used in cable television and other broadband multichannel systems.

The person skilled in the art will recognize other objects and advantages of the invention, from a reading of the following brief description of the drawings, the detailed description of the invention, and the appended claims.

DETAILED DESCRIPTION OF THE INVENTION

Figure 1:
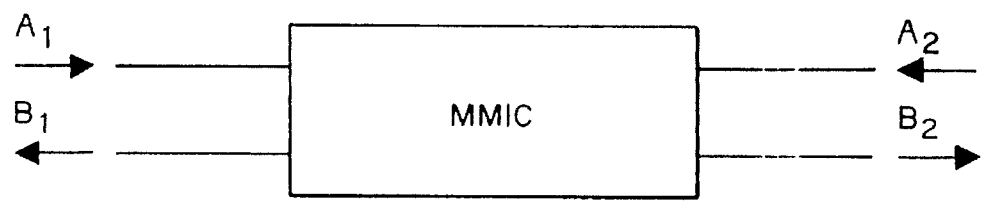
FIG. 1 provides a schematic diagram of an amplifier, used for illustrating the definition of the scattering parameters associated with the amplifier device used in the present invention.
Figure 2:
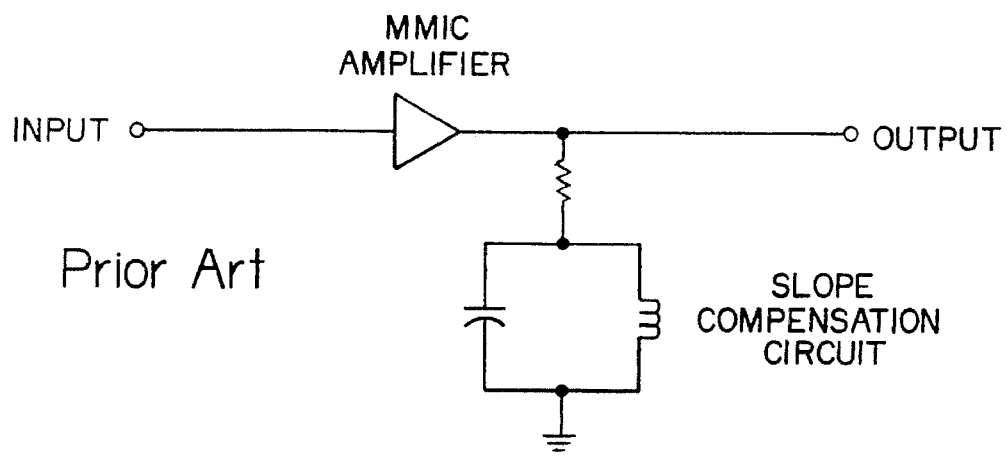
FIG. 2 provides a schematic diagram of an amplifier of the prior art, using an RLC circuit which compensates for variation in gain of the amplifier.

FIG. 1 illustrates the terminology used in this disclosure. The block in FIG. 1 represents an amplifier, and the values $A_1$, $A_2$, $B_1$, and $B_2$ represent amounts of power traveling in the directions indicated by the arrows. In general, the latter values are represented as complex numbers It is customary to define four "scattering parameters", also known as "s parameters", as follows:

$$s_{11}=B_1/A_1$$

$$s_{22}=B_2/A_2$$

$$s_{21}=B_2/A_1$$

$$s_{12}=B_1/A_2$$

The following description refers to the scattering parameters defined above.

Figure 4A:
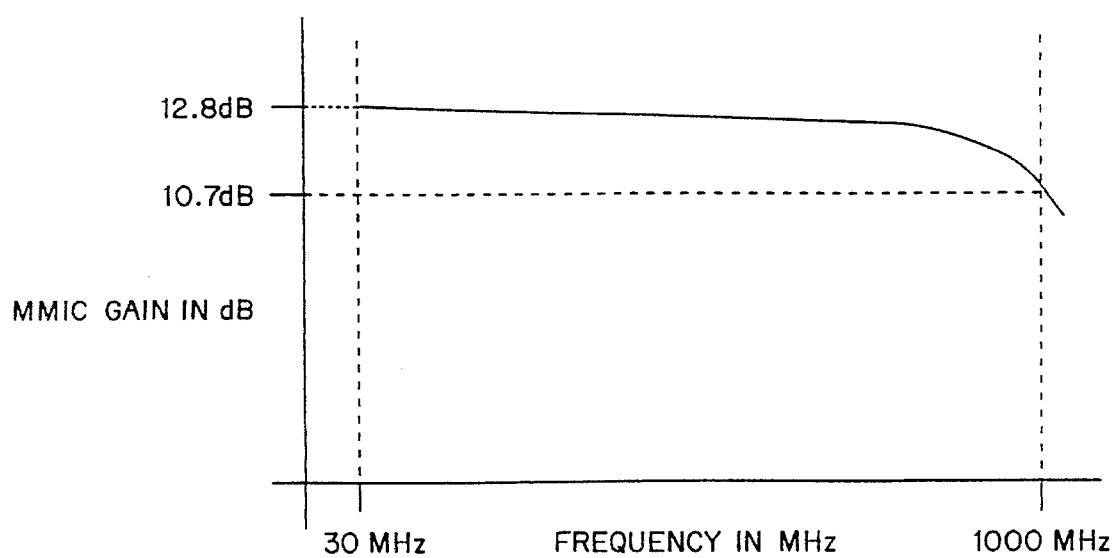
FIG. 4a provides a graph showing the gain of the monolithic microwave integrated circuit (MMIC) used in the present invention, over the frequency range of interest.

In an amplifier having a flat response over a wide frequency range, one cannot use precisely tuned circuits. Instead, the designer must choose among several techniques that together produce a flat frequency response. The present invention uses the technique of providing microstrip transmission lines (i.e. matching networks) that purposely mismatch the input and output impedances of the amplifier device (which could be a MMIC amplifier, an MIC, or a transistor), so as to compensate for the negative slope of the frequency response ($|s_{21}|$) of the device. FIG. 4a provides a graph showing the frequency response of a Hewlett-Packard MSA-1104 MMIC amplifier, over the range of 30 MHz through 1000 MHz. For discrete transistors, the slope of the response curve is typically about 6 dB per octave. For MMIC amplifiers, the frequency response is more flat, but still not sufficient over a five-octave range.

When one mismatches the input and output impedances of the amplifier, the result is an improvement in the flatness of the frequency response curve over a wide bandwidth. However, because the impedance characteristics (as represented by scattering parameters $s_{11}$ and $s_{22}$) of the MMIC amplifier are usually not constant over a wide bandwidth, the input and output return loss characteristics of the amplifier will not be optimized over the entire frequency range, when using the above technique. In other words, even though the gain characteristic of the amplifier has been corrected, the input and output VSWR will vary over the bandwidth, and will be optimum only at certain frequencies. The latter fact illustrates the trade-off that is made to obtain the flat frequency response over a five-octave bandwidth.

It is possible to add more circuitry to improve the VSWR performance, but the latter approach adds to the cost of the system. It turns out that an amplifier having the desired characteristics can be produced using a combination of a slope compensation circuit and appropriately chosen microstrip matching networks, as described below.

The following description outlines the procedure used for designing an amplifier system according to the present invention. In the example to be described, the basic amplifier device is the Hewlett-Packard MSA-1104 MMIC amplifier. However, the invention is not limited to this particular amplifier, nor is it necessarily limited to MMIC amplifiers. The techniques of the present invention can be applied to other brands and types of amplifiers.

Figure 4B:
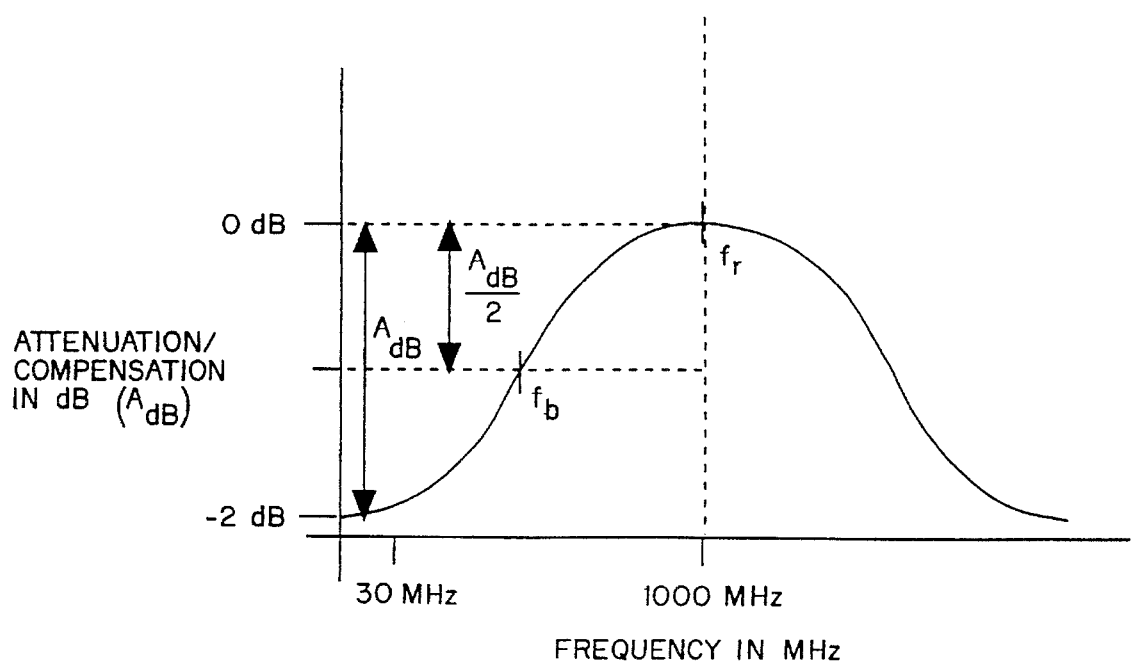
FIG. 4b provides a graph showing the response curve of the compensation circuit which is used both in the prior art and in the circuit of the present invention.
Figure 4C:
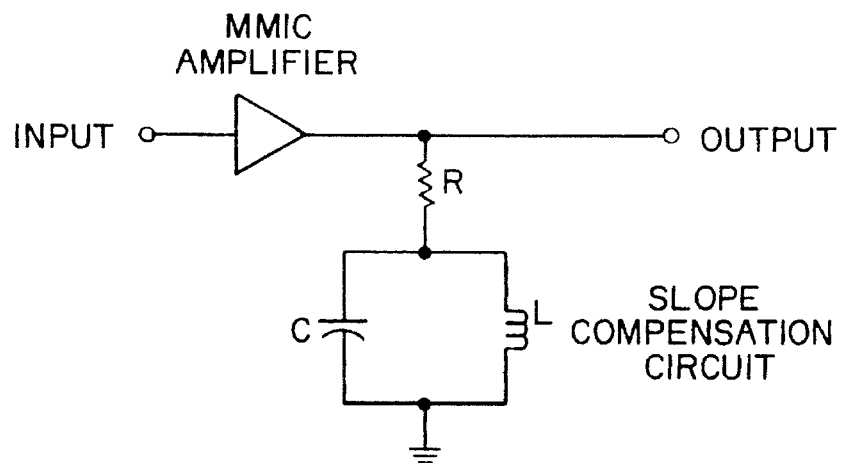
FIG. 4c provides a schematic diagram of a MMIC amplifier and gain compensation circuit, as used both in the prior art and in the present invention.

As shown in FIG. 4a, the Hewlett-Packard MSA-1104 has a gain of 12.8 dB at 30 MHz and a gain of 10.7 dB at 1000 MHz. Thus, this amplifier has a frequency response curve showing a negative slope of 2.1 dB over the above range. To equalize the frequency response over this bandwidth, one uses a compensation circuit, such as the one shown in FIG. 4c. Note that the gain characteristics of the MMIC amplifier itself cannot be changed because they are inherent to the device. But the overall frequency response of the system can be adjusted by adding circuitry having frequency response characteristics that mirror those of the MMIC device. This mirroring effect is accomplished by inserting a functional attenuation curve that has the greatest effect at the low frequency (30 MHz) and little or no effect at the high frequency (1000 MHz). In FIG. 4b, the value of attenuation created by the slope compensation circuit at the point labeled "A dB" is equal to −2 dB. The latter attenuation substantially equalizes the gain difference of the MMIC between the high and low frequencies. The values of the components of the slope compensation circuit are determined as follows:

$$R=R_o/2(k-1)$$

$$C=2/(2\pi f_r)^2 L$$

$$L=(R_o(b^2-1)\sqrt{k}/(4\pi f_r b^2(k-1)))$$

where $R_o$=characteristic impedance of the circuit $b=f_r/f_b$, where $f_b$ is the frequency at which half the attenuation occurs, and $f_r$ is the frequency of the upper limit of the desired range, k is defined by the equation A dB=20 log k.

As discussed above, the impedance of this circuit over the required bandwidth is not constant. While the slope compensation circuit alone will indeed improve the flatness of the frequency response, its varying impedance characteristics will cause ripple in the frequency response. Thus, it is necessary to provide more circuitry to achieve the desired gain flatness of +/−0.5 dB. For this purpose, one provides the microstrip networks described below.

Figure 5:
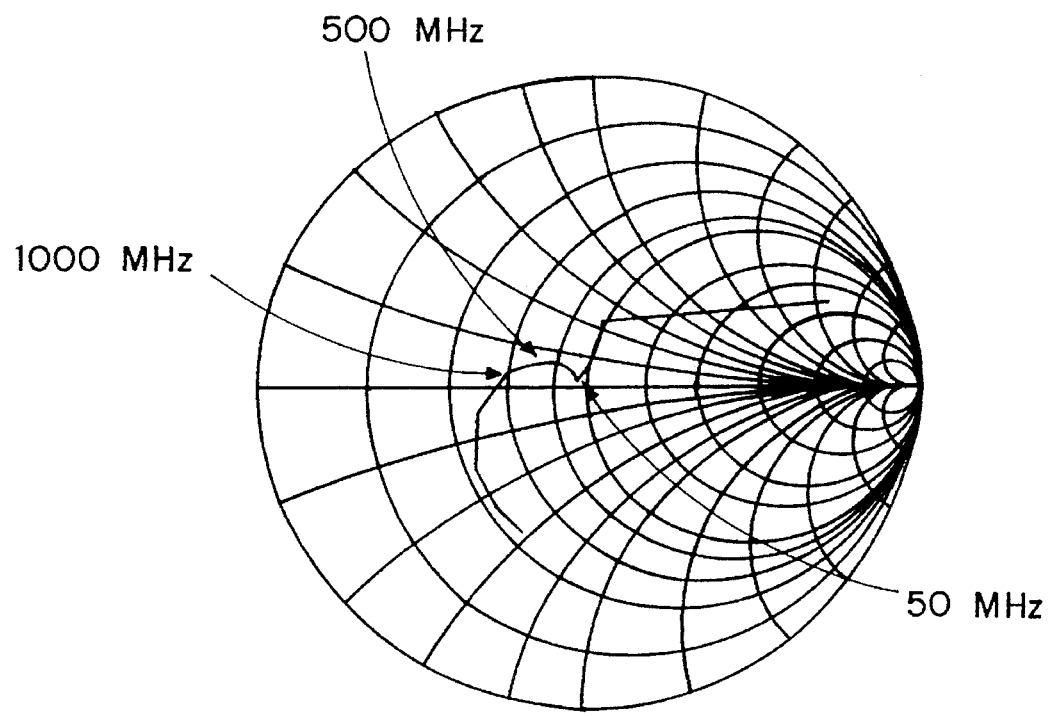
FIG. 5 shows a Smith chart which can be used to calculate impedance values when performing the calculations needed to design the microstrips used in the present invention.

It has been discovered that providing an intentional mismatch between input and output impedances of the MMIC amplifier makes the frequency response of the overall circuit essentially flat over a bandwidth of five octaves. The following description shows the steps of the procedure used to determine the impedances of microstrips to be connected to the input and output sides of the MMIC amplifier:

1. One first determines the values of the real parts of the values of $s_{22}$ for the MMIC amplifier, at the upper and lower limits of the frequency range of interest. The manufacturer of the MMIC generally provides values of all of the scattering parameters. If these values are provided in polar coordinates, one can easily obtain the values of their real parts by using a Smith chart, such as is shown in FIG. 5. The Smith chart of FIG. 5 includes a plot of the values of $s_{22}$ for various frequencies. In this example, suppose that the frequency range is 50 MHz to 1000 MHz. Then the value of the real part of $s_{22}$ at 50 MHz is 48 ohms, and the value of the real part of $s_{22}$ at 1000 MHz is 37 ohms.

2. One then takes the geometric mean of the two real parts obtained in step 1. In the example given, the geometric mean of 37 and 48 is 42.14.

3. One then takes the geometric mean of the result obtained in step 2 and the system impedance. In this example, the circuit is to be used in a 75 ohm system. Therefore, one obtains the geometric mean of 42.14 and 75, which is 56.22, or roughly 56 ohms.

4. Next, one designs input and output microstrip networks to be connected to the amplifier device. The output microstrip network must have an impedance equal to the result obtained in step 3. The input microstrip network must have an impedance which is at least twice that of the output impedance. In this example, the impedance of the output microstrip network is 56 ohms, and the impedance of the input microstrip network is 112 ohms or more. Therefore, in this example, the value of 112 ohms is preferred. In the specific example used, the microstrip could not support impedances greater than 125 ohms, due to the dielectric constant and the width-to-height ratio of the material. For materials having other values of dielectric constant and/or width-to-height ratio, it is possible to provide microstrips having greater impedances, and the invention is intended to include all such cases.

The relationship between the optimum value of the impedance of the input microstrip, and that of the output microstrip, was empirically determined. It has been discovered that, by building the input and output microstrip networks having impedances determined according to the procedure described above, the resulting amplifier circuit has the desired excellent flatness characteristics, throughout the desired five-octave bandwidth.

The actual physical dimensions of the microstrip lines that make up the matching networks are calculated using known procedures. The dimensions are determined, in part, by the mechanical characteristics of the printed circuit board material, including its dielectric constant and thickness.

Figure 3:
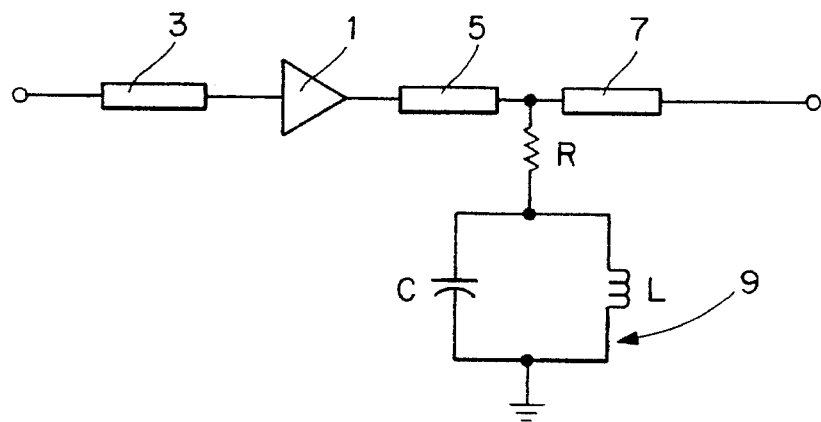
FIG. 3 provides a schematic diagram of the basic structure of a circuit made according to the present invention.

A basic form of the resulting amplifier circuit is shown in FIG. 3. MMIC amplifier 1 is connected to microstrip 3 at its input side. The output network comprises microstrips 5 and 7, and slope compensation circuit 9.

Figure 6:
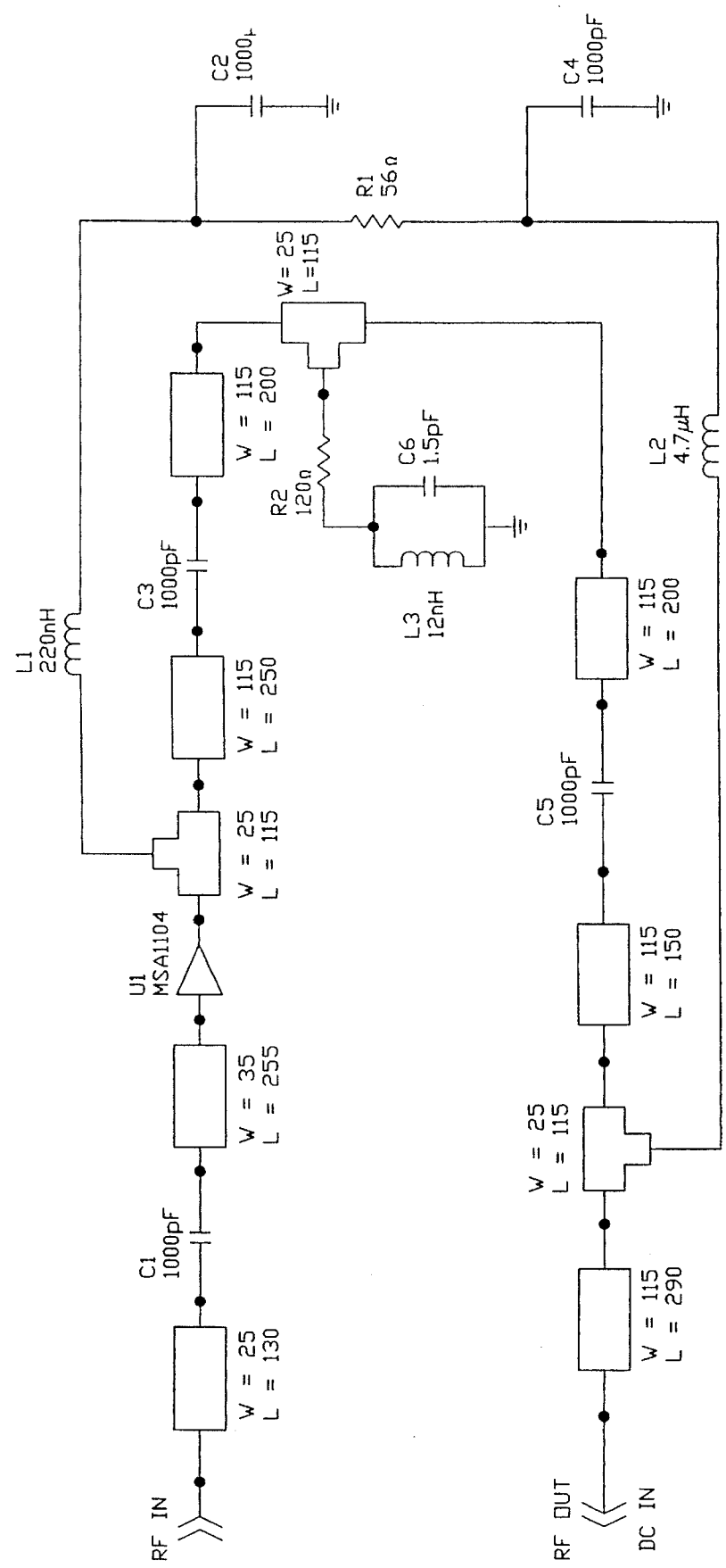
FIG. 6 provides a schematic diagram of a preferred embodiment of the present invention.

FIG. 6 shows a more practical circuit made according to the invention, wherein all impedance calculations were based on the use of epoxy-glass printed circuit board material (FR-4) with a thickness of 0.062 inches and a dielectric constant of 4.7. In FIG. 6, the input microstrip network comprises two microstrips separated by a capacitor. The capacitor removes unwanted low-frequency components. The output network includes more microstrips, including three "T"-shaped microstrips used to connect the amplifier circuit to portions of a slope compensation network. The output network also includes several filtering capacitors. The width and length of each microstrip is indicated in the figure.

It is desirable, but not necessary, that the input and output impedances of the amplifier device not be excessively mismatched at the outset. In quantitative terms, the real and imaginary parts of $s_{11}$ and $s_{22}$ should not differ from each other by more than about 20%. Also, if one performs the steps outlined above with $s_{11}$ in the same manner as with $s_{22}$, the final geometric mean obtained from step 3 should not differ from the geometric mean obtained from $s_{22}$ by more than about 20%. In the example given above, when one performs the recited steps using $s_{11}$ instead of $s_{22}$, the result of step 3 is 58 ohms, which is very close to the 56 ohm value obtained using $s_{22}$. However, in many cases, it is possible to practice the present invention successfully even if the input and output impedances differ from each other by more than 20%.

The invention is not limited to the example discussed above, or to any one type of amplifier or MMIC amplifier.

Many variations of the invention are possible, as will be apparent to the reader skilled in the art. Such variations should be considered within the spirit and scope of the following claims.

What is claimed is:

1. In an amplifier circuit, the circuit including an input network, an amplifier device, and an output network, the amplifier device having a scattering parameter $s_{22}$ which corresponds to output impedance of the amplifier device, the scattering parameter being a complex number, the improvement wherein the output network has an impedance calculated by taking a first geometric mean of real parts of $s_{22}$ at two selected distinct frequencies, and by next taking a second geometric mean of a system impedance with said first geometric mean, and wherein the input network has an impedance which is at least twice the impedance of the output network, wherein the amplifier circuit exhibits nearly uniform amplification over a range defined by said selected distinct frequencies.

2. The improvement of claim 1, wherein the input network has an impedance which is approximately twice the impedance of the output network.

3. The improvement of claim 1, wherein the input and output networks comprise microstrips electrically connected to the amplifier device, wherein the microstrips have impedances determined in part by their dimensions.

4. The improvement of claim 3, further comprising a slope compensation circuit connected to the amplifier device.

5. The improvement of claim 4, wherein the slope compensation circuit comprises a resistor in series with a parallel combination of an inductor and a capacitor.

6. The improvement of claim 1, further comprising a slope compensation circuit connected to the amplifier device.

7. The Improvement of claim 6, wherein the slope compensation circuit comprises a shunt circuit including a resistor in series with a parallel combination of an inductor and a capacitor.

8. The improvement of claim 1, wherein the amplifier device also has a scattering parameter $s_{11}$ which corresponds to the input impedance of the amplifier device, and wherein an impedance calculated by taking a first geometric mean of real parts of $s_{11}$ at said two selected distinct frequencies, and by next taking a second geometric mean of the system impedance with said first geometric mean of real parts of $s_{11}$ does not differ from the geometric mean obtained with $s_{22}$ by more than about 20%.

9. The improvement of claim 1, wherein the amplifier device also has a scattering parameter $s_{11}$ which corresponds to the input impedance of the amplifier device, and where the respective real and imaginary parts of $s_{11}$ and $s_{22}$ do not differ from each other by more than about 20%.

10. The improvement of claim 1, wherein the amplifier device is a monolithic microwave integrated circuit (MMIC), a microwave integrated circuit (MIC) amplifier, or a transistor.

11. In an amplifier circuit, the circuit including an input network, an amplifier device, and an output network, the input and output networks being connected to opposite sides of the amplifier device, the improvement wherein the input and output networks comprise microstrips, and wherein the input and output networks have respective input and output impedances, and wherein the input network has an impedance which is at least twice the impedance of the output network, wherein the amplifier circuit exhibits nearly uniform amplification over a range of frequencies, further comprising a slope compensation circuit connected to the amplifier device.

12. The improvement of claim 11, wherein the slope compensation circuit comprises a shunt circuit including a resistor in series with a parallel combination of an inductor and a capacitor.

13. A method of designing a broadband amplifier circuit, the amplifier circuit being operable over a frequency range having a lower limit and an upper limit, the amplifier circuit including an input network, an amplifier device, and an output network, the input and output networks being connected to input and output ends of the amplifier device, the amplifier device having a scattering parameter denoted $s_{22}$, the amplifier circuit having a system impedance, the method comprising the steps of:

a) determining values of the real parts of $s_{22}$ for the amplifier device, at the lower limit and upper limit of the frequency range, b) calculating a geometric mean of the real parts obtained in step (a), c) computing a geometric mean of the result of step (b) and the system impedance, d) setting the impedance of the output network equal to the result of step (c), and e) setting the impedance of the input network equal to at least twice the impedance of the output network.

14. The method of claim 13, wherein step (e) comprises setting the impedance of the input network equal to twice the impedance of the output network.

15. The method of claim 13, wherein the input and output networks comprise microstrips connected to the amplifier device, and wherein steps (d) and (e) are performed by choosing dimensions of the microstrips.

16. The method of claim 13, further comprising the step of providing a slope compensation circuit connected to the amplifier device.

17. The method of claim 13, wherein the amplifier device also has a scattering parameter $s_{11}$ which corresponds to the input impedance of the amplifier device, and wherein the method further comprises the steps of repeating steps (a) through (c) using parameter $s_{11}$, and comparing the result obtained using $s_{22}$ with the result obtained using $s_{11}$.

18. A method of designing a broadband amplifier circuit, the amplifier circuit being operable over a given frequency range, the amplifier circuit including an input network, an amplifier device, and an output network, the input and output networks being connected to input and output ends of the amplifier device, the method comprising the steps of:

a) calculating input and output impedances of the amplifier device over said frequency range, b) designing the input and output networks such that the input network has an impedance equal to at least twice the impedance of the output network, wherein the input and output networks comprise microstrips, and whereto the designing step is performed by choosing dimensions of the microstrips, and c) providing a slope compensation circuit connected to the amplifier device.

* * * * *